United States Patent [19]
Glavish

[11] Patent Number: 5,672,879
[45] Date of Patent: Sep. 30, 1997

[54] SYSTEM AND METHOD FOR PRODUCING SUPERIMPOSED STATIC AND TIME-VARYING MAGNETIC FIELDS

[76] Inventor: Hilton F. Glavish, 803 Tyner Way, Incline Village, Nev. 89450

[21] Appl. No.: 489,348

[22] Filed: Jun. 12, 1995

[51] Int. Cl.⁶ ............................................. H01J 37/147
[52] U.S. Cl. ....................... 250/396 ML; 250/492.21; 335/210; 335/213
[58] Field of Search ............... 250/396 ML, 396 R, 250/398, 492.21, 492.2; 335/210, 213

[56] References Cited

U.S. PATENT DOCUMENTS

| | | | |
|---|---|---|---|
| 2,053,537 | 9/1936 | Schlesinger | 250/396 R |
| 2,108,091 | 2/1938 | Von Ardenne | 250/396 R |
| 2,260,725 | 1/1941 | Richards et al. | 250/396 R |
| 3,193,717 | 7/1965 | Nunan | 313/76 |
| 3,569,757 | 3/1971 | Brewer et al. | 313/63 |
| 3,911,321 | 10/1975 | Wardly | 315/364 |
| 4,063,098 | 12/1977 | Enge | 250/396 R |
| 4,260,897 | 4/1981 | Bakker et al. | 250/398 |
| 4,276,477 | 6/1981 | Enge | 250/398 |
| 4,367,411 | 1/1983 | Hanley et al. | 250/492.2 |
| 4,469,948 | 9/1984 | Veneklasen et al. | 250/396 ML |
| 4,687,936 | 8/1987 | McIntyre et al. | 250/397 |
| 4,745,281 | 5/1988 | Enge | 250/396 R |
| 4,804,852 | 2/1989 | Rose et al. | 250/492.1 |
| 4,806,766 | 2/1989 | Chisholm | 250/396 ML |
| 5,012,104 | 4/1991 | Young | 250/396 ML |
| 5,053,627 | 10/1991 | Ruffell et al. | 250/492.21 |
| 5,132,544 | 7/1992 | Glavish | 250/492.21 |
| 5,311,028 | 5/1994 | Glavish | 250/492.21 |
| 5,393,984 | 2/1995 | Glavish | 250/396 ML |
| 5,438,203 | 8/1995 | Glavish et al. | 250/396 ML |
| 5,481,116 | 1/1996 | Glavish et al. | 250/396 ML |

FOREIGN PATENT DOCUMENTS 62-88246  4/1987  Japan.

OTHER PUBLICATIONS

H.F. Glavish et al., "Fast Magnetic Scanning and Ion Optical Features of the New Ibis Oxygen Implanter," Nucl. Instr. & Methods, vol. B74, pp. 397–400 (1993). No Month.

*Primary Examiner*—Kiet T. Nguyen
*Attorney, Agent, or Firm*—Fish & Richardson P.C.

[57] ABSTRACT

A magnetic system for producing a magnetic field having static and high frequency time-varying components comprising: two magnetic poles defining a gap therebetween, the poles being formed with electrically insulating material for confining any high frequency induced eddy currents to limited values in local paths in the poles; an ac coil associated with the magnetic poles for producing a time-varying magnetic field in the gap; a magnetic structure including a yoke and two cores which are respectively coupled to the two poles, the magnetic structure being formed of solid material, with a high magnetic saturation level; and dc coils associated with the cores of the magnetic structure for producing a static magnetic field in the gap. The magnetic system are used for magnetically scanning an ion beam and an ion implantation system, both of which are based on the above system, as well as a magnetic system useful for magnetic resonance imaging applications.

28 Claims, 10 Drawing Sheets

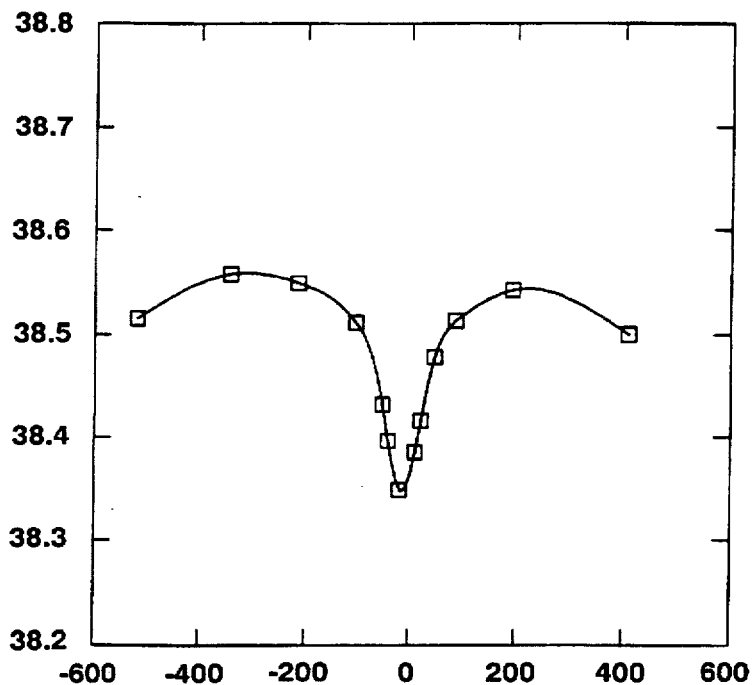
FIG. 9   SCANNER FIELD (GAUSS)
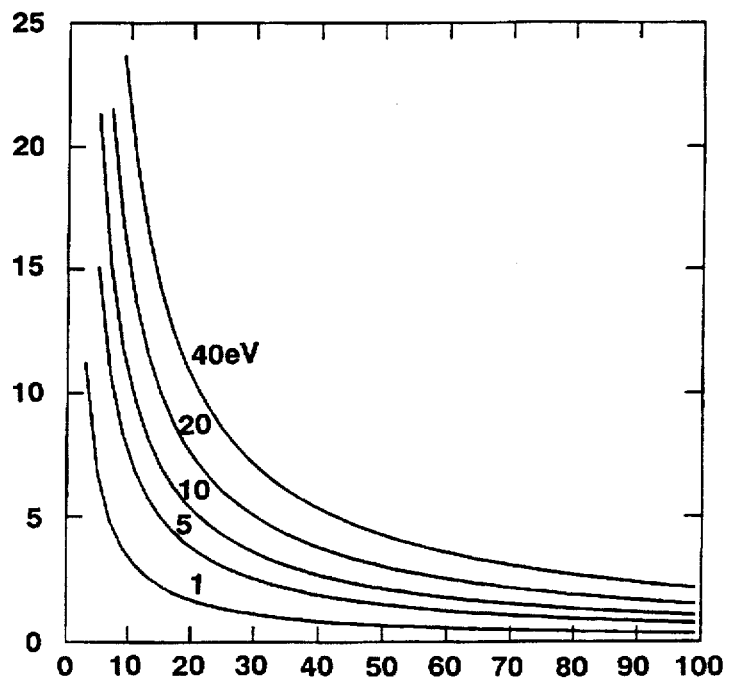
FIG. 10   FIELD (GAUSS)

SYSTEM AND METHOD FOR PRODUCING SUPERIMPOSED STATIC AND TIME-VARYING MAGNETIC FIELDS

BACKGROUND OF THE INVENTION

This invention relates to system and method for producing superimposed static and time-varying magnetic fields that are useful, e.g., in ion implanters that scan heavy ion beams of atoms and molecules of the elements and in magnetic resonant imaging systems in which high frequency oscillatory or pulsed magnetic fields must be superimposed on static magnetic fields.

There are many industrial and scientific applications that require surfaces to be uniformly irradiated by ion beams. For example, modification of semiconductors such as silicon wafers is often implemented by ion implanters, in which a surface is uniformly irradiated by a beam of ions or molecules of a specific species and energy. Because the physical size of the wafer or substrate (e.g., about 5 inches in diameter or more) is larger than the cross-sectional area of the irradiating beam (e.g., about 2 inches in diameter or less), the required uniform irradiance is commonly achieved by scanning the beam across the wafer or scanning the wafer through the beam, or a combination of these techniques.

It is distinctly advantageous to have a high beam scan rate over the substrate for a number of reasons: the irradiance uniformity is more immune to changes in the ion beam flux; a higher wafer throughput is possible at low dose levels; and for high dose applications degradation from local surface charging, thermal pulsing, and local particle-induced phenomena such as sputtering and radiation damage are greatly reduced.

Scanning techniques based only upon reciprocating mechanical motion are very limited in speed. Motion of the wafer on an arc through the beam greatly improves the scan speed but requires many wafers or substrates to be simultaneously mounted on a rotating carousel in order to obtain efficient utilization of the beam.

In a common variation, a time varying electric field is used to scan the beam back and forth in one direction, while the wafer is reciprocated in another direction. In this hybrid-type of implanter the beam current and hence rate at which wafers can be processed is severely limited by the space-charge forces which act in the region of the time-varying electric deflection fields. These forces cause the ions in the beam to diverge outward, producing an unmanageably large beam envelope. Such a space-charge limitation also occurs in implanters that use time-varying electric fields to scan the beam in two directions.

Space-charge blow-up is the rate at which the transverse velocity of a beam increases with distance along the beam axis. This is proportional to a mass normalized beam perveance $$\xi = I\, M^{1/2} E^{-3/2} \qquad (1)$$

where I is the beam current, M is the ion mass, and E is the ion energy. (The Physics and Technology of Ion Sources, Ed. Ian G. Brown, John Wiley & Sons, New York 1989). For typical ion beam configurations encountered in ion beam implanters, space-charge effects become limiting at a perveance of $\xi = 0.02 [mA][amu]^{1/2}[keV]^{-3/2}$. Thus, an 80 keV arsenic beam becomes space-charge limited at −1.7 mA, while a 5 keV beam is space-charge limited at just −0.03 mA. Therefore, scanning an ion beam with an oscillatory electric field is not viable for an efficient commercial ion implanter in which the beam current is preferably greater than a few milliamperes, even at energies as low as 10 keV.

A scanning magnet that produces a high frequency time-varying magnetic field for scanning ion beams in implanters is described in U.S. Pat. No. 5,311,028, in which a scanning magnet that has a yoke formed from laminations of high magnetic permeability separated by relatively thin electrically insulating material can be used to scan high perveance, heavy ion beams at frequencies up to 1,000 Hz.

In many magnetic resonance imaging devices, the static uniform magnetic field for spin precession is produced by a solid core electromagnet. When high frequency gradient fields are superimposed on the static magnetic field by energizing certain coils disposed in and around the working gap of the electromagnet, eddy and screen currents induced in the pole surfaces and/or shielding envelopes distort the gradient fields and also increase the output power requirements of the energizing gradient power amplifiers.

There are other circumstances beyond ion implantation and magnetic resonance imaging where it is desirable to have structures that produce time-varying magnetic fields superimposed on static magnetic fields. The performance of such structures is limited by the difficulty in producing the time-varying fields accurately and with reduced power.

SUMMARY OF THE INVENTION

In one aspect, the invention features an apparatus for producing a magnetic field having static and high frequency time-varying components comprising: two magnetic poles defining a gap therebetween, the poles being formed with electrically insulating material for confining any high frequency induced eddy currents to limited values in local paths in the poles; an ac coil associated with the magnetic poles for producing a time-varying magnetic field in the gap; a magnetic structure including a yoke and two cores which are respectively coupled to the two poles, the magnetic structure being formed of solid material, with a high magnetic saturation level; and dc coils associated with the cores of the magnetic structure for producing a static magnetic field in the gap.

The respective energizing electric circuits for the ac and dc coils are operated independently in order to independently control the time-varying and static magnetic field components in the gap. The static component of magnetic flux passes through the entire cross section of the pole caps, solid cores, and solid return yoke, the magnetic reluctance being very small as in a conventional dc electromagnet. On the other hand the Fourier oscillatory components of magnetic flux in the central region of the gap mainly link the ac coils by passing through the inner area of the coils, and returning via the low reluctance path offered by the laminated or ferrite pole caps, and the gap region outside the coil boundary. An important aspect of the invention is the use of solid cores and return yoke which present a high magnetic reluctance to the oscillatory flux components, confining them to just a skin-depth layer over the outer surface of the cores and yoke. Only a small fraction of the total oscillatory magnetic flux passes through the cores, inducing only a small voltage in the dc energizing coils, enabling these coils to be excited with a simple dc power supply, rather than with a power source possessing a frequency response and voltage capability sufficient to overcome the induced voltages that would otherwise occur if the oscillatory flux coupling were high.

In another aspect, the inventive apparatus described above includes an ac current source for energizing the ac coil with a time-varying oscillatory electric current to produce a magnetic field in the gap that alternates in direction with time at a fundamental frequency of the order of 20 Hz or greater together with substantially higher order harmonics.

Embodiments may include one or more of the following features.

In some embodiments, the poles are preferably formed from a plurality of laminations of high magnetic permeability material separated by electrically insulating layers, the laminations providing a low reluctance magnetically permeable path for the high frequency time-varying component of the produced magnetic field. In some embodiments, the poles comprise different sets of laminations of high magnetic permeability material separated by electrically insulating material, the sets being disposed cross-wise to each other so that magnetic flux passing through any given lamination in one of the sets is distributed into a multiplicity of laminations in another of the sets. Each of the laminations preferably has a thickness in the range between about 0.2 and 1 millimeter. The insulating layers are preferably substantially thinner than the laminations. The laminations are preferably iron alloy laminations. The yoke and cores are preferably formed of solid iron.

In another embodiment, the poles are formed from ferrite material. A liner, formed from, e.g., silicon, is preferably provided for shielding the ferrite material from the ion beam.

In some preferred embodiments for scanning ion beams, a source of an ion beam is preferably provided for introducing the ion beam into the gap. An end station is also preferably arranged to position in the path of the scanned ion beam a semiconductor substrate having a selected surface for receiving the scanned ion beam. In one embodiment a vacuum housing extends from the ion source, about the magnetic system to the end station whereby the beam is exposed directly to the poles as the beam travels under vacuum from the ion source to the end station. A velocity separator is preferably disposed in the path of the ion beam for removing singly-charged ions from the ion beam before the ion beam irradiates the selected surface so that higher final ion energies can be obtained from the multiply-charged ions remaining in the beam. A liner is preferably provided for shielding the laminated poles from an ion beam. In one preferred embodiment, the ion beam passes into the gap along a first beam path and a dc sector magnet is positioned to receive the ion beam after the beam has passed through the gap and has been deflected to one side of the first beam path as a result of the influence of the scanning magnetic field.

In another aspect, the invention features a method for scanning an ion beam over a selected surface comprising the steps of: providing a scanning magnet corresponding to the above-described apparatus; passing an ion beam into the gap along a first beam path; and generating in the ac and dc coils energizing waveforms to produce in the gap a substantially unipolar scanning magnetic field that varies in magnitude as a function of time to cause scanning of the ion beam over the selected surface.

In some preferred embodiments, the ion beam is further deflected away from the first beam path after the beam has passed through the gap and has been deflected to one side of the first beam path so that the beam travels at a substantial angle relative to the direction of the first beam path to cause a substantial proportion of neutral particles that may exist in the beam to be removed from the beam before the beam irradiates the selected surface.

With regard to ion scanning applications, the present invention also addresses unexpected plasma conditions that can occur and have been observed in magnetic ion beam scanning. This effect appears as a sudden change in the beam emittance (i.e., the area occupied by all of the ions when displayed on a plot of ion angle versus position) when the scanning magnetic field used to scan the ion beam passes through or approaches zero. The invention provides techniques to produce superimposed static and time-varying magnetic fields with reduced power requirements. In one embodiment, the invention enables enhancement of radiation uniformity, accuracy, and repeatability achievable by ion implanters. An induced electric field, associated with the time-varying magnetic scanning field, inductively accelerates or decelerates neutralizing electrons in the ion beam depending upon the relative change of the magnitude of the scanning magnetic field. As the magnetic scanning field decreases to a small magnitude, the neutralizing electrons within the beam expand over an area that is comparable or greater than the beam cross-section. Whereas, as the magnetic scanning field increases in magnitude to greater than, e.g., about 50 Gauss, the neutralizing electrons are compressed into an area that is typically less than the cross-sectional area of the beam. The inventor believes that the rapid redistribution of electron density resulting from the above-mentioned induced electric fields generates a plasma effect that causes the emittance of the ion beam to fluctuate in the manner observed. The invention provides a magnetic circuit that maintains the magnitude of the magnetic fields in the gap at a sufficient level to prevent the transverse cross-section of the ion beam from fluctuating in size while the ion beam is being scanned across the selected surface. Thus, the novel magnetic system described herein can uniformly scan ion beams in a manner that substantially reduces changes or fluctuations in the beam size, and that enables repetitive scanning at high rates, high accuracy, and improved repeatability.

In another aspect, the invention features an apparatus for producing a magnetic field having static and high frequency time-varying components comprising: two magnetic poles defining a gap therebetween, the poles comprise different sets of laminations of high magnetic permeability material separated by electrically insulating material, the sets being disposed cross-wise to each other so that magnetic flux passing through any given lamination in one of the sets is distributed into a multiplicity of laminations in another of the sets; an ac coil associated with the magnetic poles for producing a time-varying magnetic field in the gap; a magnetic structure including a yoke and two cores which are respectively coupled to the two poles, the magnetic structure being formed of solid material, with a high magnetic saturation level; and a dc coil associated with the cores of the magnetic structure for producing a static magnetic field in the gap.

In a further aspect, the invention features an apparatus for producing a magnetic field having static and high frequency time-varying components comprising: two magnetic poles defining a gap therebetween, the poles being formed from high magnetic permeability ferrite material; a pair of electrical conductors, each of the conductors being positioned at opposite sides of the gap, the conductors being constructed and arranged to produce a magnetic gradient field over a substantial portion of the region of the gap; an ac coil associated with the magnetic poles for producing a time-varying magnetic field in the gap; a magnetic structure including a yoke and two cores which are respectively coupled to the two poles, the magnetic structure being formed of solid material, with a high magnetic saturation level; and a dc coil associated with the cores of the magnetic structure for producing a static magnetic field in the gap.

Embodiments may include one or more of the following features. A pair of electrical conductors are preferably included, each of the conductors being positioned at opposite sides of the gap, the conductors being constructed and arranged to produce a magnetic gradient field over a substantial portion of the region of the gap. A second pair of electrical conductors are also preferably included, each of the second pair of conductors being positioned at opposite sides of the gap, the conductors of the second pair being constructed and arranged to produce a second magnetic gradient field over a substantial portion of the region of the gap, the first magnetic gradient field intersecting the second magnetic gradient field. The conductors of the first pair of conductors preferably extend in a first direction in a plane parallel to the pole faces and the conductors of the second pair of conductors extend in a plane parallel to the second pair of conductors in a direction orthogonal to the first direction.

Embodiments may include one or more of the following advantages. The inventive ion beam magnetic scanner does not cause significant beam size variations fluctuations during scanning nor associated non-uniformities in the irradiation dose on a target, by preventing the magnetic field in the scanner from becoming too small. An ion beam can, therefore, be repetitively scanned with high accuracy and repeatability in writing speed and position with time at the target. The invention enables magnetic field production with reduced power loss and reduced ac reactive power, reducing power supply and power amplifier costs. The inventive magnetic structure does not have large insulator surfaces exposed to the beam which would cause space charge blow-up. The invention further enables operation in a high vacuum. The inventive magnetic structure is easy and practical to include in an ion implanter or any scanning ion beam system. The invention also enables enhancement in some of magnetic resonance imaging techniques.

Other features and advantages will become apparent from the following description and from the claims.

BRIEF DESCRIPTION OF THE DRAWINGS

FIG. 9 is a plot of the variation in oxygen ion beam current at the wafer surface as a function of the magnitude of the scanner magnetic field.

FIG. 10 is a plot of the gyro-radius of an electron as a function of magnetic field strength and electron energy.

DESCRIPTION OF THE PREFERRED EMBODIMENTS

Figure 1:
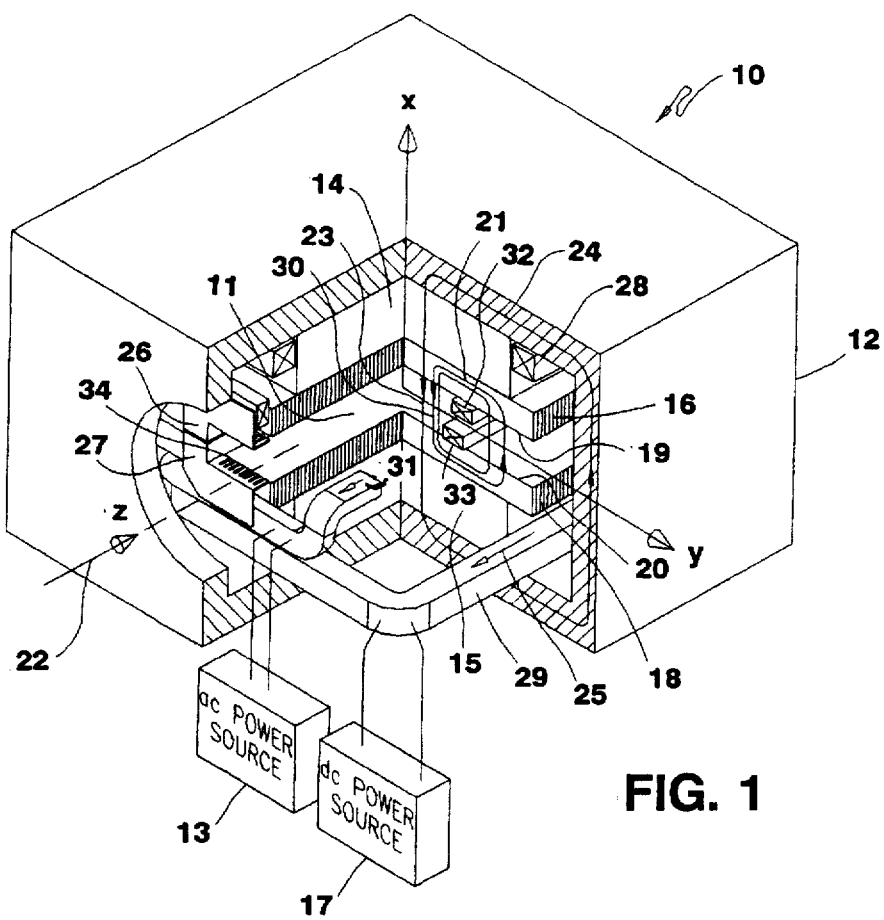
FIG. 1 is a diagrammatic, perspective view of a magnetic system for producing superimposed static and time-varying magnetic fields.
Figure 2:
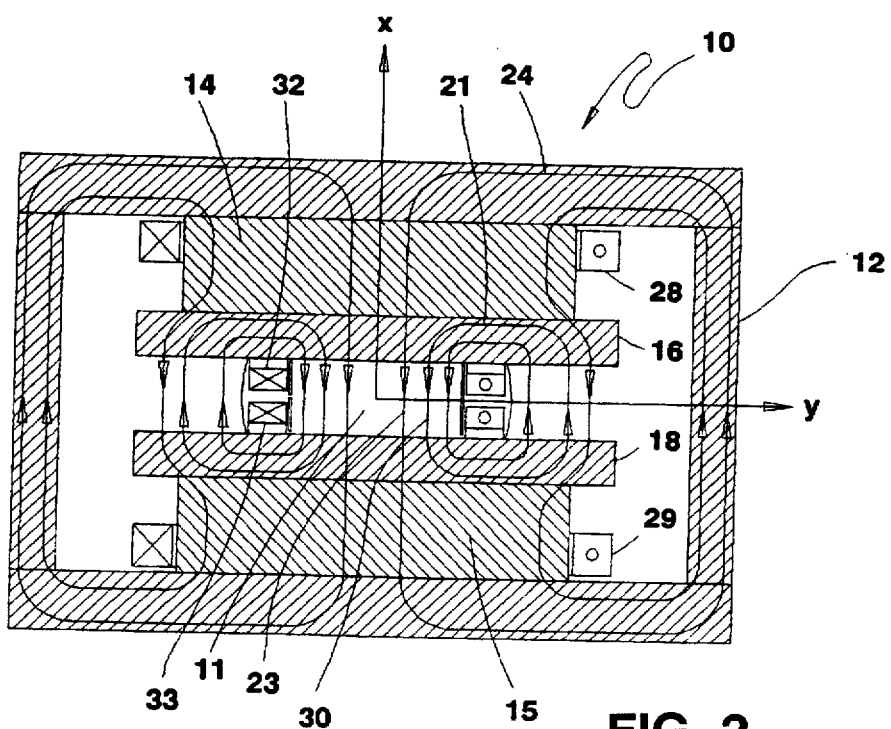
FIG. 2 is a diagrammatic cross-section of the magnetic system of FIG. 1 taken through the xy-plane.
Figure 3:
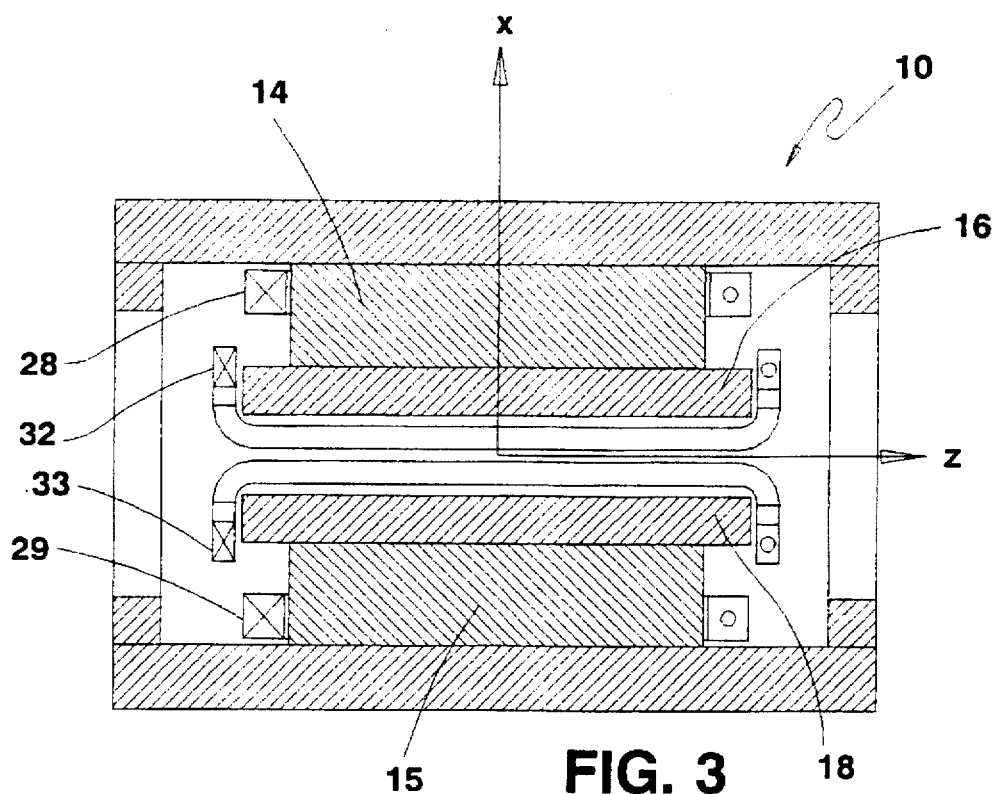
FIG. 3 is a diagrammatic cross-section of the magnetic system of FIG. 1 taken through the zx-plane.

Referring to FIGS. 1, 2, and 3, a magnetic system for producing superimposed static (dc) 23 and oscillatory (ac) 30 time-varying magnetic fields in a working gap 11, includes a return yoke 12 and cores 14, 15 constructed from solid, high magnetic permeability iron, and pole pieces 16, 18 constructed from thin, high permeability, iron laminations, interleaved with very thin layers of electrically insulating material. The magnetic structure is symmetrical about the median plane (i.e., the yz-plane) of the working gap defined in FIG. 1. The lamination planes are parallel to the xy-plane, and the pole surfaces 19, 20 facing the working gap are substantially parallel to the yz-plane. The poles 16, 18, adjoining cores 14, 15, and adjoining yoke 12, offer a low reluctance return flux path 24 for the dc magnetic field 23 produced bypassing a dc current 25 through a pair of dc coils 28, 29, which are positioned around the iron cores. The pole pieces 16, 18, embodying the above-described laminated structure reduce eddy currents and offer a low reluctance flux return path 21 for the oscillatory fourier components of the ac field. The ac field is produced by passing an ac electric current 31 through a pair of ac coils 32, 33, which are positioned inside the working gap 11. The ac field flux is established in one direction inside the boundary of the ac coils and in the opposite direction in the peripheral region outside the boundary of the ac coils.

Referring to FIG. 1, the pair of ac coils and the pair of dc coils are independently energized with electric current by ac and dc power sources 13, 17, respectively. The solid structure of the cores 14, 15 and return yoke 12 provide a high magnetic reluctance path for time-varying magnetic fields, confining the oscillatory flux components to just a skin-depth layer over the outer surface of the cores and yoke. Consequently, only a small fraction of the total oscillatory magnetic flux passes through the cores. With this structure, there is little ac coupling in the dc coils; this reduces the capital cost of the dc power source because it does not need to withstand high induced ac voltages. This decoupling further enables the ac and dc power sources to be operated independently (the ac and dc magnetic field amplitudes in the working gap 11 can be selected independently). In particular, the embodiment described in FIG. 1 enables ac magnetic fields of arbitrary magnitude to be efficiently superimposed on large dc magnetic fields. In this case, the capital cost of the ac power source is also reduced, since the current output need only be sufficient for producing the ac field amplitude rather than the combined ac and dc field amplitude.

In the embodiment shown in FIGS. 1, 2, and 3, the pole area in the peripheral region outside the ac coil boundary is sufficient for returning the oscillatory flux. The ac coil amp-turns J required for generating an oscillatory field $B_o$ are $$J = \frac{1}{\mu_o} B_0 G \left( 1 + \frac{A_i}{A_0} \right) \quad (2)$$

where $\mu_o$ is the magnetic permeability of a vacuum, G is the x dimension of the magnet working gap, $A_i$ is the effective area inside the ac coil boundary, and $A_0$ is the effective area for flux return of the peripheral region outside the ac coil boundary. The amp-turns J decrease as $A_0$ increases with respect to $A_i$, and in practice need only be 25–50% higher than the minimum value corresponding to $A_0 \rightarrow \infty$:

$$J_{min} = \frac{1}{\mu_0} B_{ac} G \quad (3)$$

The laminated structure for the pole pieces 16, 18 described above is an efficient and practical method for providing a low reluctance return path for oscillatory components of time-varying magnetic fields, allowing uniform ac fields to be produced in working gaps with reduced power levels and reduced levels of resistive losses from eddy currents. In such a structure, the ac field waveform variation with time can have a fundamental frequency up to a kilo-Hertz or more, with higher order fourier harmonics superimposed to produce triangular waveforms suitable for scanning heavy ion beams, such as that shown in FIG. 4.

In a preferred embodiment, each pole is constructed of high permeability, thin ferromagnetic laminations 20 of thickness in the range of commercially available laminations, e.g., 0.2 and 1.0 millimeter, separated by electrically insulating material of thickness on the order of about 0.02–0.1 millimeter. Further details of laminated structures are described in H. F. Glavish, U.S. Pat. No. 5,311,028, and H. F. Glavish and M. A. Guerra, *Nucl. Instr. & Methods*, B74 (1933) 397–400, both of which are incorporated herein by reference. These references also describe the use of high permeability ferrite material for avoiding large eddy currents.

Figure 5:
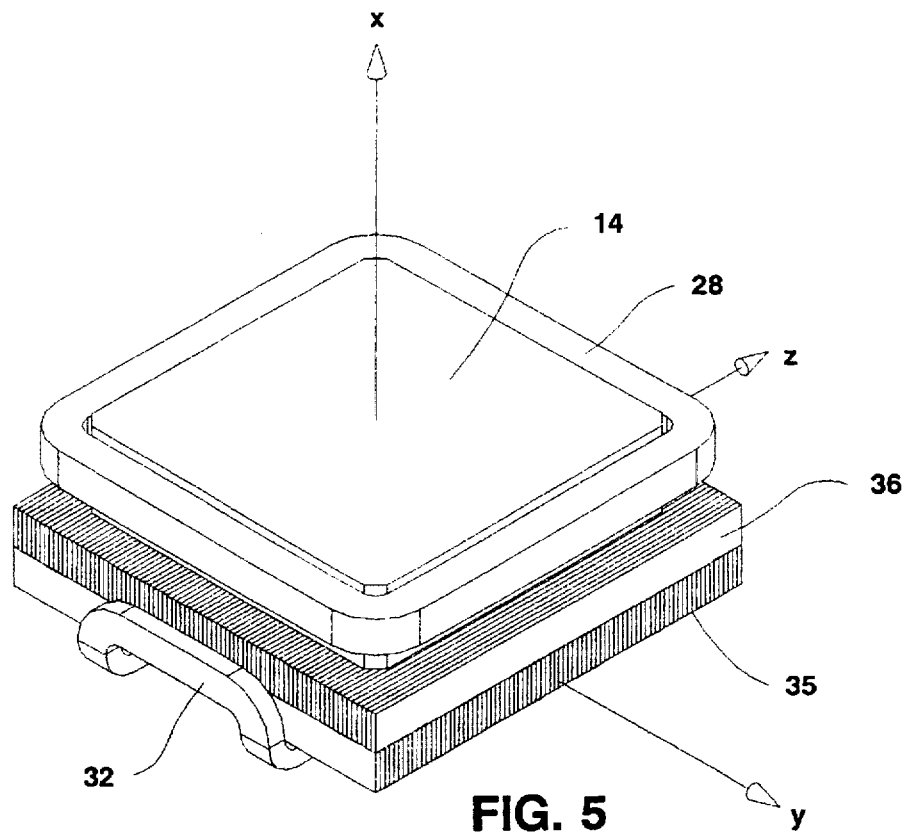
FIG. 5 is a diagrammatic perspective view of a pole with crossed laminations.
Figure 7:
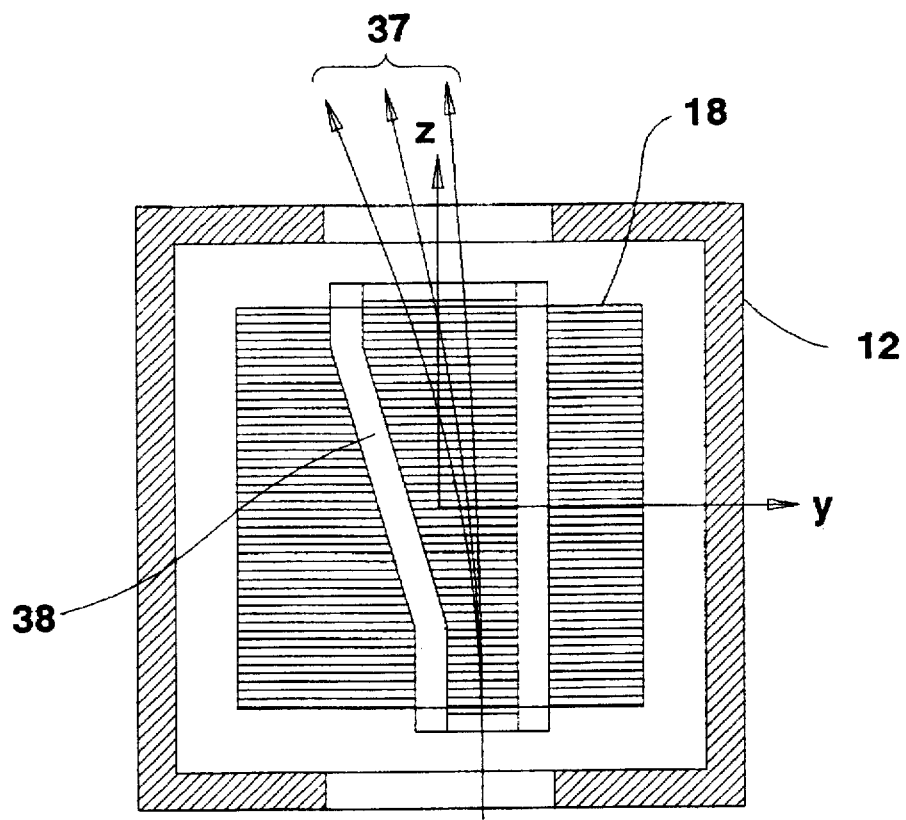
FIG. 7 is a diagrammatic cross-sectional view of contoured ac coils.

The laminations in the poles 16, 18 of the embodiment shown in FIG. 1 lie in planes parallel to the xy-plane and provide a low reluctance return path in the xy-plane for magnetic field generated by the particular ac coil configuration of FIG. 1. In some applications, there may be additional ac coils (FIG. 15) or contoured ac coils (FIG. 7). In such embodiments, low reluctance flux return paths are preferred in other planes orthogonal to the median symmetry plane (yz-plane) of the working gap 11 to provide efficient redistribution of magnetic flux across the poles. This is achieved by constructing the pole pieces with crossed laminations as shown in FIG. 5. One set 35 of laminations have planes parallel to the xy-plane and the other set 36 have planes parallel to the zx-plane, enabling flux to be redistributed along low reluctance paths in any planes orthogonal to the yz-plane. This property and further details of crossed laminations are described in the references cited above.

Application to Ion Beam Scanning

Figure 4:
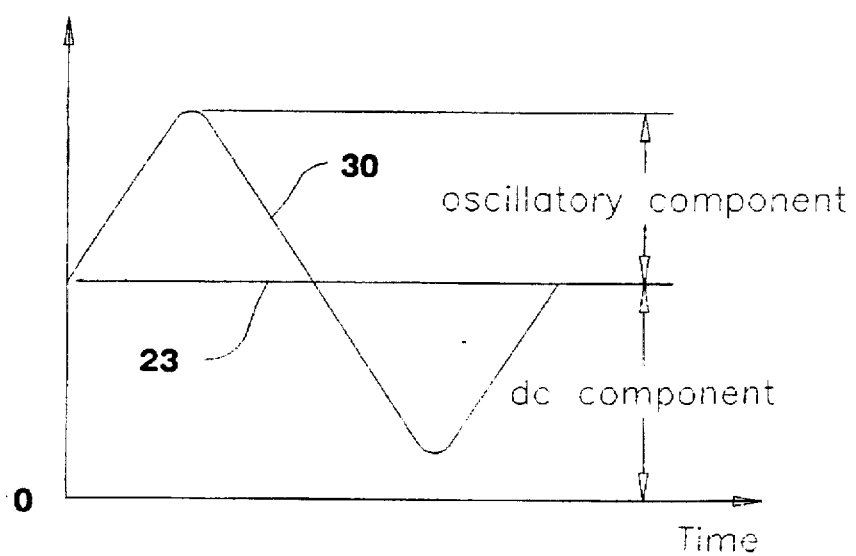
FIG. 4 schematically shows the variation of the current passing through the ac coils with time for a triangle shaped waveform.

By energizing the ac coils 32, 33 with a triangular waveform such as that shown in FIG. 4, the magnetic system shown in FIG. 1 can be used to scan a heavy ion beam 22 entering the working gap 11 along the z-axis, from side-to-side in the ±y directions.

Figure 6:
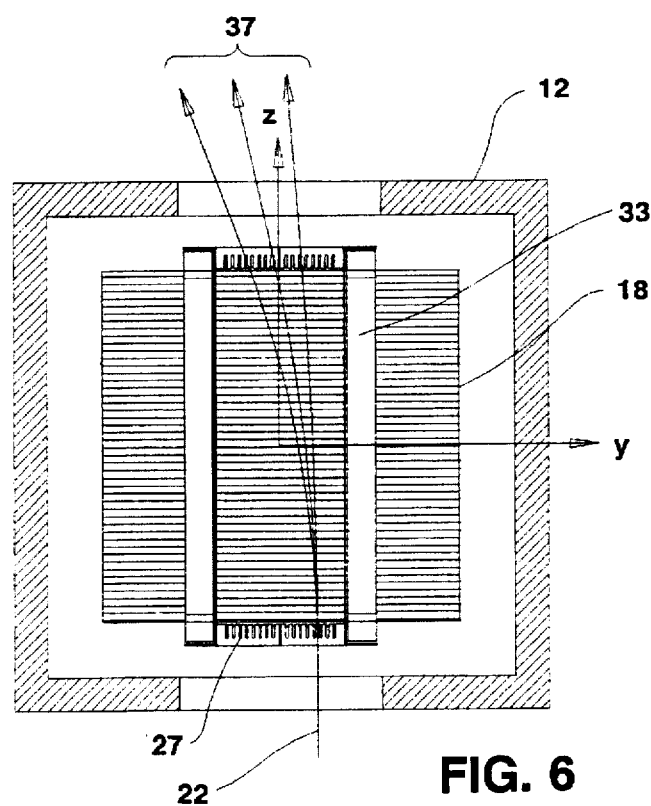
FIG. 6 is a diagrammatic view of an ion beam being scanned in the presence of a superimposed static magnetic field.

Referring to FIG. 6, superimposing a dc magnetic field by energizing the dc coils 28, 29 (FIG. 1) with a dc current, further deflects the beam 22 so that it is scanned from side-to-side 37 more predominantly in the −y direction than the +y direction, or vice versa, depending on the polarity of the dc electric current energizing the dc coils. The reactive power necessary to generate the oscillatory field for scanning an ion beam in the presence of a superimposed dc deflection is reduced by contouring 38 the ac coils around the resultant beam trajectories 37 such as to reduce the coil area, as shown in FIG. 7. Such a contoured coil shape results in a non-uniform correspondence between the flux produced inside the coil boundary and the available flux paths provided by a pole with a single set of parallel laminations, outside the coil boundary. Accordingly, a cross-laminated pole such as that shown in FIG. 5 is used to provide a low reluctance return path for the oscillatory magnetic flux.

The ion beam 22 is preferably transported through the working gap 11 in a vacuum of typically better that $10^{-5}$ millibar in order to avoid loss and scattering of the ions via interaction with the background gaseous molecules. In the embodiment shown in FIG. 1, the yoke body 12 forms a gas-tight vacuum envelope for transporting the ion beam 22 through the working gap 11. Except for the negligibly small area of the edges of the inter-lamination insulating material, the pole faces facing the beam are electrically conducting and are held at ground electrical potential to avoid generating electric fields in the vicinity of the beam. For the same reason, the insulating surfaces of the coils and the electrical leads to and from the coils are hidden from the beam with electrically grounded shields 26, 27.

In another embodiment, the vacuum envelope is placed in the working gap between the pole faces of the scanner magnet. However, this increases the magnetic field volume and power requirements of the working gap 11; furthermore, the material of the vacuum wall is preferably an electrical conductor that defines a constant potential in the vicinity of the beam. To avoid inducement of large eddy currents in the vacuum envelope walls, the vacuum walls are preferably made from a semiconductor material, or a laminated structure similar to the magnetic poles; such laminations are preferably non-ferromagnetic.

Figure 8:
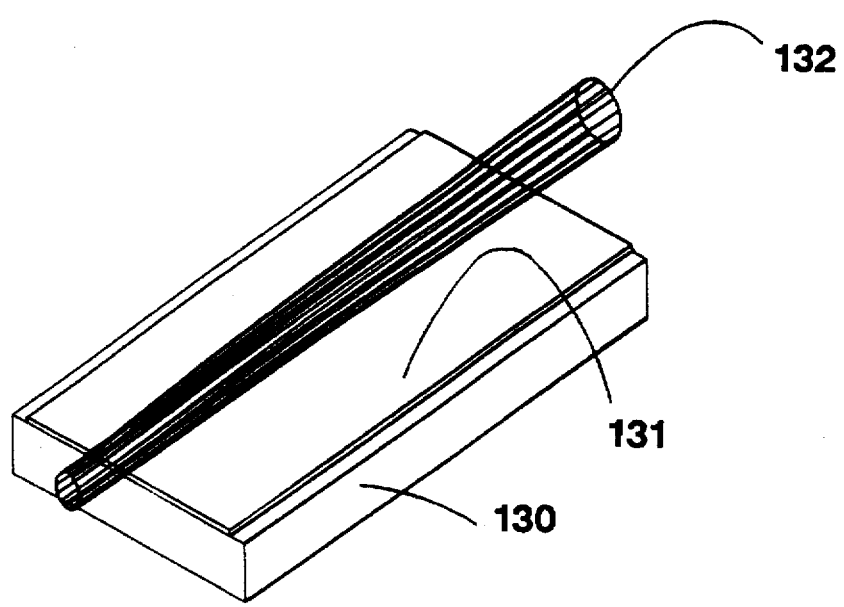
FIG. 8 is a perspective view of a silicon liner placed on the pole surface of a magnet.

As described above, ferrite material may be used rather than laminations for avoiding large eddy currents. Since ferrite material is an electrical insulator, pole pieces and other structures formed of ferrite material must be shielded from the ion beam either using, e.g., a silicon shield, or using an electrically conducting wire mesh or grid that is constructed to eliminate eddy current effects. Referring to FIG. 8, a thin silicon liner 131 is used to shield an ion beam 132 from a pole surface 130. Ions in the beam tend to strike the surfaces inside the ion beam system, which tends to cause particles to be released into the ion system. Since the liner is made of silicon, any contamination resulting from the liner would at least be compatible with, e.g., silicon wafer substrates, and would not tend to degrade the quality of the devices formed from the irradiated wafers. Also, because silicon is an electrical conductor it maintains a constant electrical potential in the proximity of the beam, yet the conductivity of silicon is sufficiently low that the silicon can be used in scanning magnets with acceptably small eddy current effects. A silicon liner can also be employed in a bending magnet to avoid sputtering contamination of the wafer. Such a silicon liner may also be used in any of the embodiments described herein to shield laminated poles and thereby reduce induced eddy current effects.

In ion beam scanning applications the magnetic system 10 (FIG. 1) can be used to address an observed plasma effect that would otherwise cause the transverse cross-section of the ion beam to fluctuate in size while the ion beam is being scanned across a selected surface. As described in pending application Ser. No. 08/259,919, filed Jun. 10, 1994, and in U.S. Pat. No. 5,438,203, we have discovered that when a heavy, high perveance ion beam, is magnetically scanned substantial fluctuations occur in the transverse beam size after the scanner if the scanning magnetic field passes through zero or becomes less than about 50 to 200 Gauss. These fluctuations, if left uncorrected, can degrade the uniformity of irradiation on a downstream substrate. The invention herein achieves a substantial improvement in the uniformity of surface irradiation by energizing the ac coils 32, 33 of the scanner to produce a dc field superimposed on the oscillatory scanning field such that the resultant of the superimposed magnetic fields has a minimum magnitude that is large enough to prevent the transverse cross-section of the ion beam from substantially fluctuating in size while the beam is being scanned across the selected surface.

Heavy ions, such as those derived from the elements of boron, nitrogen, oxygen, phosphorus, arsenic, or antimony, are generated and formed into a beam by an ion source (see e.g., The Physics and Technology of Ion Sources, Ed. Ian G. Brown, John Wiley & Sons, New York 1989). The ion source produces very high perveance ion beams as defined in Eq. 1, and an adjustable voltage power supply is used to accelerate the ion beam to an adjustable energy up to about 80 keV per charge state. Electrons generated by the energizing of the ion beam become trapped or confined within the ion beam. Thus, the ion beam becomes nearly electrically neutral in the absence of external electric fields and insulating surfaces. Under such conditions, the ion beams can be transported in the regions of high vacuum in the ion implanter, without exhibiting beam divergence from the action of repelling space-charge forces.

Electrons of a few electron-volt energy are typically generated by the atomic interaction of the ions in the ion beam with the residual gas molecules in the vacuum system (see, e.g., in A. J. T. Holmes, Beam Transport of the Physics and Technology of Ion Sources, Ed. Ian G. Brown, John Wiley & Sons, New York 1989). In the vicinity of the ion beam, such electrons play an important role in neutralizing all but a small fraction of the positive charge associated with the ions of the beam. In some instances, neutralizing electrons are also generated directly from hot filaments or plasma guns, but this is not generally necessary for the transport of typical high perveance heavy ion beams through the magnets and field free regions found in a typical ion implanter. In the vacuums of approximately $10^{-6}$ torr used in ion implanters a sufficient number of electrons are generated by the beam, within fractions of a millisecond, to maintain the charge-neutrality of the beam.

Hitherto, it has been thought that detrimental time-dependent space-charge effects would be absent in magnetic scanning of ion beams used in ion implanters because of the very high rate of generation of electrons relative to the rate at which the transverse position of the beam changes. Indeed, to those skilled in the art, the magnetic field of the scanner are commonly regarded as quasi-static with respect to space-charge effects.

However, we have discovered a plasma effect that manifests as a sudden change in the beam emittance when the magnitude of the magnetic field in the gap passes through or approaches zero. An example of our experimental data is shown in FIG. 9, which vividly illustrates how the current of a high perveance 178 keV, 150 Hz scanning oxygen beam undergoes a sudden fluctuation of ≅0.7% near a zero field. The data shown has been taken using a scan frequency of f=150 Hz over a phase range of ϕ=−70° to ϕ=60° where ϕ=360 ft. The oscillatory magnetic field (in Gauss) varied with phase according to the equation $$B \cong 706.5(\phi/90) - 61.28(\phi/90)^2 - 123.7(\phi/90)^3 + 22.4(\phi/90)^5$$
$$(-90° \leq \phi \leq 90°) \quad (4)$$

The fluctuation near zero field shown in FIG. 9 is for just one scan sweep, but it accurately reproduces itself in successive scan sweeps. The measured beam current in the data shown in FIG. 9 is sensitive to changes that occur in the phase-space emittance of the beam in the direction transverse to the scan direction due to a limiting aperture that is placed before the current measuring apparatus. If the above-described effects are not substantially eliminated, or substantially compensated for by appropriate correction of the energizing waveform, a 1% or more irradiance non-uniformity can result.

In the presence of a magnetic field B, the neutralizing electrons of a beam experience a Lorentz force and gyrate around the magnetic field lines with an angular frequency $$\omega = \frac{e}{m} B \quad (5)$$

where |B| is the magnitude of the magnetic field, m is the mass of an electron, and e is the charge of an electron. When projected on a plane perpendicular to B, the electrons describe a circle of radius $$r = \frac{mv_t}{eB} \quad (6)$$

where $v_t$ is the electron velocity component transverse to the direction of the magnetic field B. The energy associated with the orbital motion is $$U = \tfrac{1}{2} m v_t^2 \quad (7)$$

Since the magnitude of the electron gyro-frequency (w≅17.6 MHz per Gauss) is much greater than the scan frequency of the magnetic field (~1 kilohertz or less), the electron orbital motion is adiabatic in the sense that for a small fractional change to occur in the radius r, an electron will make many revolutions around B. Referring to FIG. 10, the electron gyro-radius is plotted as a function of electron energy and magnetic field. At fields less than a few tens of Gauss the gyro-radius increases to the point where it becomes comparable to the beam dimension. However, this phenomena alone does not appear to account for the observed time-dependent fluctuation in the ion beam current, because in the absence of a significant magnetic field, the electron motion is determined principally by the forces associated with particle charges. Moreover, as previously discussed, beam neutralization occurs in a very short time relative to the time interval over which the fluctuation occurs (~1 millisecond).

Figure 11:
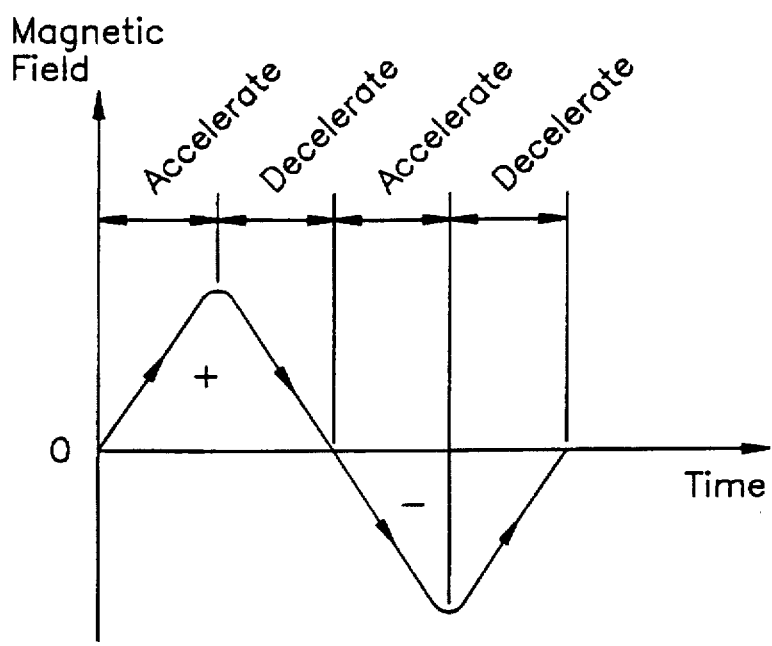
FIG. 11 is a plot of an oscillatory magnetic field as a function of time showing the regimes in which the inductive electric field accelerates or decelerates electrons.

To better account for the observed phenomena, we realized that, according to Maxwell's equations for the description of classical electromagnetic phenomena, there is associated with the time variation of the scanner field B, an electric field E given by $$\nabla \times E = -\frac{\partial B}{\partial t} \quad (8)$$

and that such a field must inductively accelerate, or decelerate, electrons according to whether the amplitude of B is increasing or decreasing, as shown in FIG. 11. Indeed, the change in orbital energy per revolution is $$\delta U = \oint eE \cdot ds = e \int_S (\nabla \times E) \cdot dS = -e \int_S \frac{\partial B}{\partial t} \cdot dS \quad (9)$$

If we now invoke the adiabatic condition that the radius is essentially constant for one revolution, we obtain from Eqs. 7, 8, and 9.

$$\delta(U/B)=0$$

$$\delta(r^2 B)=\delta(r^2 U)=0 \quad (10)$$

The first of these equations shows that the electron rotational energy changes proportionately with the magnetic field strength. The second equation expresses the conservation of angular momentum and shows that the area $\pi r^2$ of an electron orbit varies inversely with the amplitude of the magnetic field strength and electron energy. The effects arising from the inductive electric fields are significant. For example, as the field increases from 5 to 50 Gauss, the electron density is compressed by a factor of ten. The electron energy is also increased by a factor of ten and in the presence of the magnetic field the electrons are bound to a region in the vicinity of the beam. New electrons that are generated as the magnitude of the magnetic field is increasing are also subject to the compression resulting from the inductive acceleration. In this regime, the electron spatial distribution is dominated by the action of magnetic field rather than by the action of the system of ion charges in the beam. As the field increases beyond 50 Gauss, compression continues to occur but the effect is not so dramatic because the gyration radius of the electron is already substantially less than the typical transverse dimension of the beam.

When the magnetic field amplitude decreases towards zero the electron orbits expand according to Eq. 10. When the magnetic field strength is less than approximately 50 Gauss, the electrons in the electron orbits that were previously compressed are now rapidly decelerated and expand over an area that is comparable to or greater than the beam cross section. New electrons that are generated, already have a low energy, and are not so significantly affected by the inductive electric field. The acceleration and deceleration regimes are shown in FIG. 11.

Figure 12:
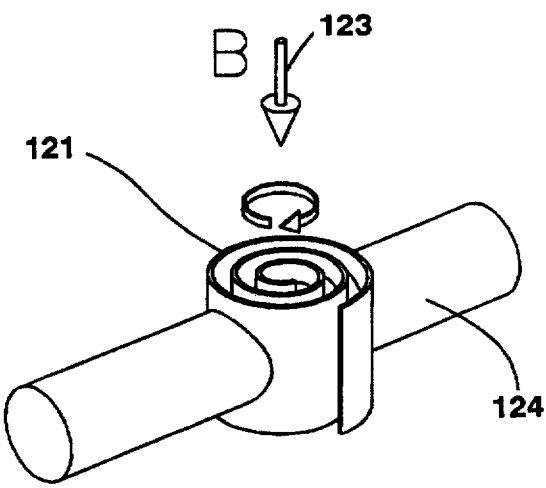
FIG. 12 is a schematic diagram illustrating how inductive deceleration causes the orbits of electrons in an ion beam to spiral outward as the magnetic field amplitude decreases with time.
Figure 12A:
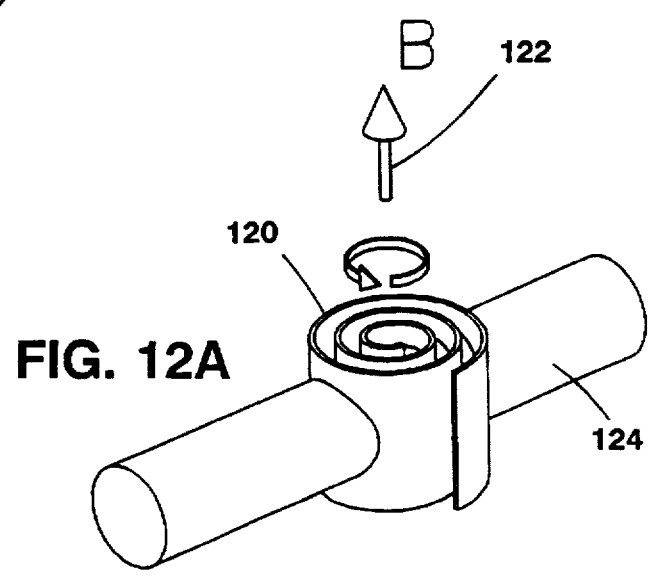
FIG. 12A is a schematic diagram illustrating how inductive acceleration causes the orbits of electrons in the ion beam to spiral inward as the magnetic field amplitude increases with time.

The sequence of events occurring in the scanner with elapsed time is schematically illustrated in FIGS. 12 and 12A. Referring to FIG. 12, as the magnetic field 123 approaches zero the inductive deceleration causes electron orbits to describe an outward spiralling envelope 121 thereby reducing the electron density in the region of the ion beam 124. After the magnetic field passes through zero it has the opposite direction and the rotation direction of the electron orbits 120 is reversed, as shown in FIG. 12A. As the magnetic field 122 now increases in amplitude, inductive acceleration causes the electron orbits to adiabatically spiral inward thereby increasing the electron density in the region of the ion beam 124. The rapidly changing electron density caused by the magnetic field passing through zero provides a plausible explanation for the observed fluctuations in the phase-space emittance of the ion beam.

Experimental observations have only been made on magnetically scanned high perveance positive heavy ion beams. However, since electrons are produced at a very high rate by negative ion beams and are a part of the overall beam neutralization phenomena in both the negative and the positive potential plasma regimes, it is expected that similar fluctuations will occur and that the present invention will also have important application for the scanning of high perveance negative ion beams.

Figure 13:
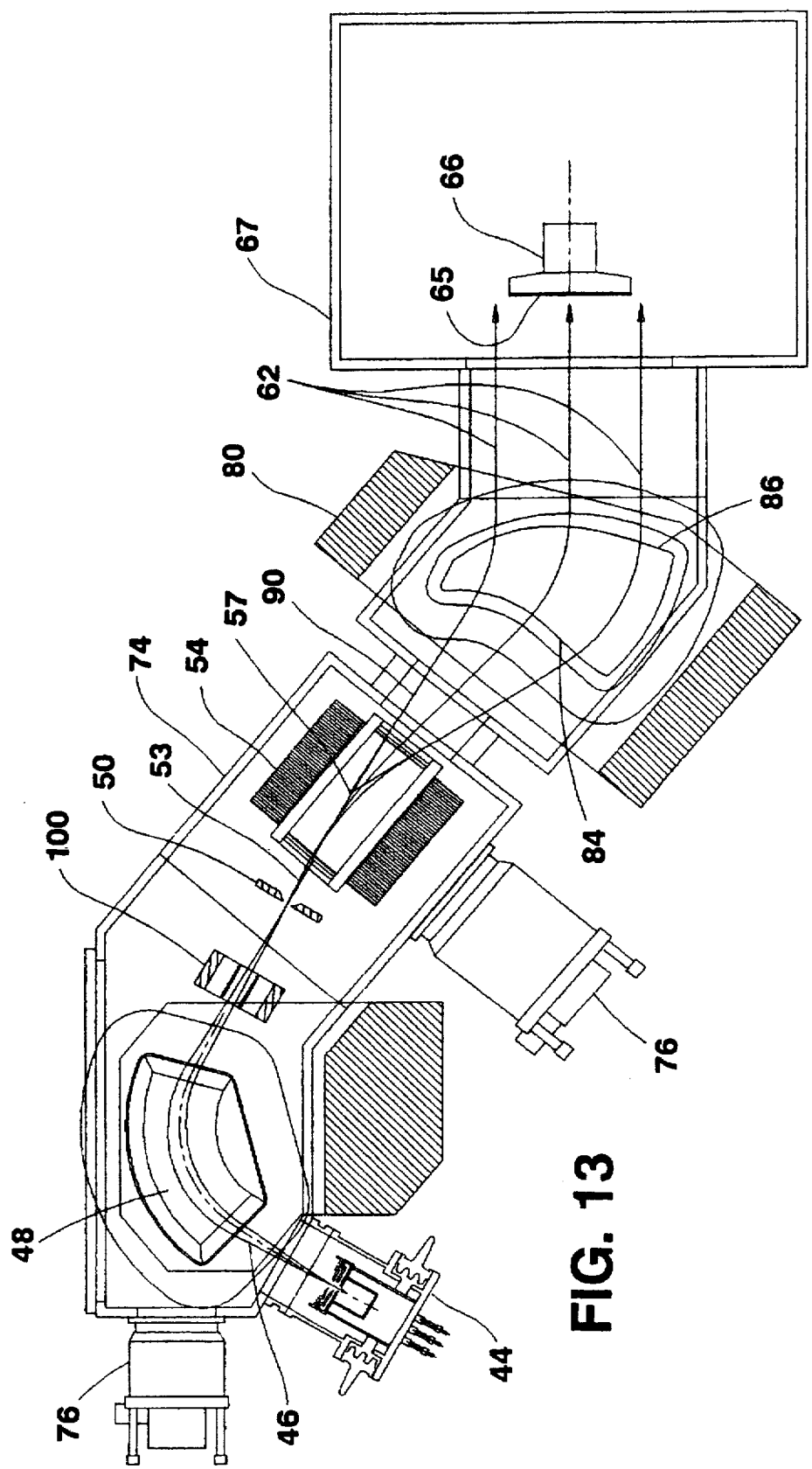
FIG. 13 is a diagrammatic cross-sectional view of an ion beam system for magnetically scanning an ion beam across the surface of a silicon wafer.
Figure 13A:
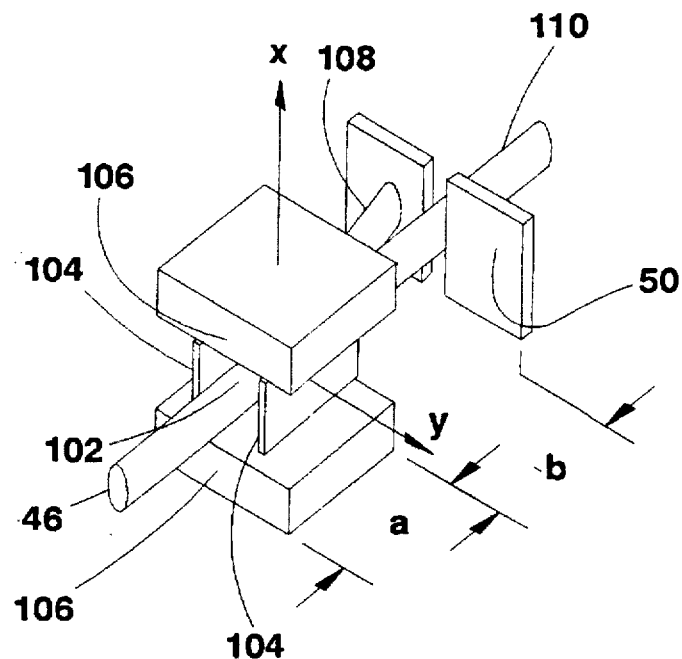
FIG. 13A is a diagrammatic perspective view of a velocity separator of the ion beam system of FIG. 13.
Figure 13B:
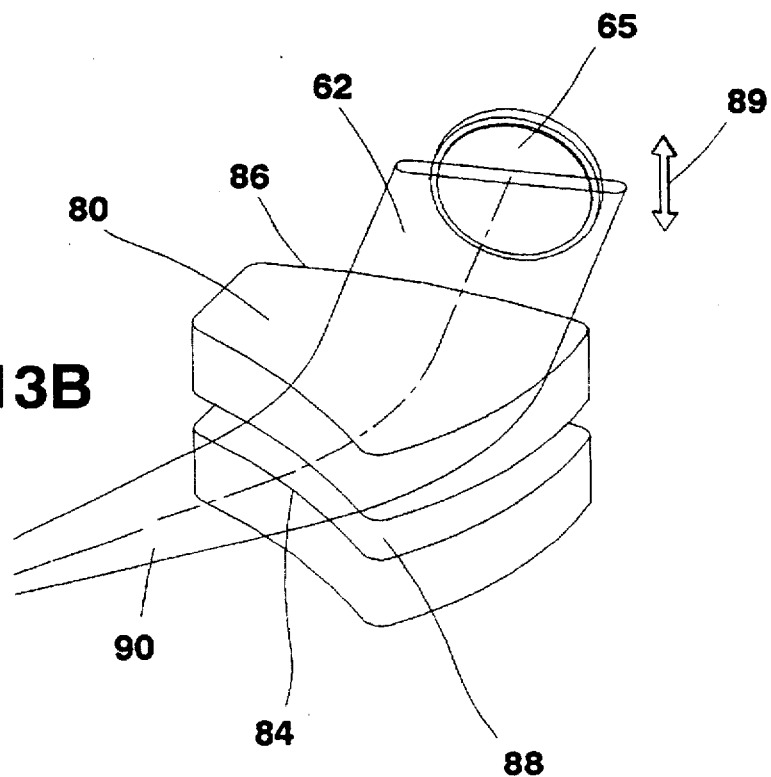
FIG. 13B is a diagrammatic perspective view of a collimator magnetic of the ion beam system of FIG. 13 directing a scanned ion beam to a wafer surface.

Referring to FIGS. 13–13B, a preferred system for scanning heavy ions includes the magnetic system of FIG. 1. Heavy ions are derived from an ion source 44 producing an ion beam 46 that generates and traps electrons within it to become nearly electrically neutral in the absence of external electric fields and insulating surfaces. The ion beam 46 undergoes ballistic drift under a vacuum to a sector magnet 48 and is momentum purified after passing through a resolving slit 50, according to the ration of the ion momentum to electric charge (Mv/q) where v is the ion velocity, q is the ion electric charge, and M is the ion mass, as previously defined in Eq. 1.

The magnetic ion beam scanning systems described here obtain higher final ion energies by extracting doubly or triply charged ions (e.g. p++ or p+++) from the ion source. When multiply charged ions are used, the sector magnet alone does not always adequately purify the beam. For example, singly-charged ions p+ can be formed from the dissociation of a molecular ion as follows $$P_2^+ \rightarrow P + P^+ \quad (11)$$

In the drift region, between the ion source 44 and the sector magnet 48, these singly-charged ions have one half the velocity of doubly charged ions p++ which have been extracted directly from the ion source. The momentum-to-charge ratio is therefor the same for the two types of ion and they will not be separated at the resolving slit by the sector magnet.

To overcome this problem, a velocity separator 100 is placed between the sector magnet and the resolving slit, as shown in FIG. 13A (see, e.g., C. A. Coombes et al., Phys. Rev., vol. 112, p. 1303 (1958), which is herein incorporated by reference). Pole pieces 106 define a working gap 102 to receive the beam and produce a magnetic field in the x direction. Electrodes 104 produce an electric field in the y direction. The strengths E and B of the electric and magnetic fields are respectively set as follows $$E \geq \frac{V S_w}{ab} \quad (12)$$

$$B = \frac{E}{v} \quad (13)$$

where v is the velocity of the doubly-charged ion to be selected, V is the extraction voltage of the ion source, Sw is the width of the resolving slit 50, a is the effective length of the working gap of the velocity separator, and b is the drift distance from the exit of the velocity separator to the resolving slit. Equation (12) ensures the electric field strength is sufficient to reject the singly-charged ions 108 at the resolving slit, while equation (13) ensures the magnetic and electric forces acting on the doubly-charged ions cancel, allowing ions 110 to pass through the separator without being deflected.

The beams 53 emerging from the resolving slit 50 passes into a scanner magnet 54 corresponding to magnetic system 10 of FIGS. 1–3. The scanner magnet can have crossed laminated poles as shown in FIG. 5 and contoured ac coils as shown in FIG. 7.

As shown in FIG. 13B, the scanned beam 90 emerging from the scanner magnet is collimated by a sector collimator magnet 80 that produces a substantially static uniform magnetic field in a working gap 88 with entrance 84 pole edge and exit 86 pole edge. The pole edges are especially contoured to form a parallel scanned beam 62 at wafer 65 in an end station 67. The wafer 65 is mounted on a chuck 66 which mechanically reciprocates the wafer through the beam in a direction orthogonal to the scanning plane. The time-varying waveform applied to the ac coils 55 of the scanner and the mechanical motion of the chuck are set to produce a uniform irradiance of the wafer. The dc field in the scanner is set to eliminate the beam size fluctuations previously described. The sector collimator magnet 80 cooperates with the scanner magnet 54 in regard to the different paths the beam takes to the wafer at different times during the scan cycle. The contours of the entrance and exit pole edges 84, 86 are fourth order polynomials with coefficients chosen to simultaneously achieve the following ion optical transport and focusing conditions while the beam is impinging on the wafer, irrespective of scan position:

1. Maintain a parallel scan as previously described to a precision of better than ±0.2°.
2. Maintain the range of variation of the prescribed maximum angular divergence of the beam (typically about 0.5° to 1.5°) substantially within a limit of ±0.5°.
3. Maintain the prescribed transverse beam size (typically 30 to 50 mm) substantially within a limit of ±5 mm.
4. Produce sufficient deflection of the beam (e.g., at least about 30°, and more preferably greater than about 45°) to reduce the number of neutral particles 39 striking the wafer after being formed by the ions of the beam interacting with residual gas molecules in the vacuum system prior to the beam entering the sector collimator magnet.

In general, a conventional sector magnet with pole edge contours limited to second order curvatures on the entrance and exit pole edges cannot achieve all of the above-mentioned requirements simultaneously (see, e.g., H. A. Enge, "Deflecting Magnets," published in *Focusing of Charged Particles*, vol. II, Ed. A. Septier, Academic Press, New York 1967). The limitations of second order curvatures is underscored if the collimator deflection becomes larger than about 30°, and more preferably larger than about 45°.

Fourth order contours on the entrance and exit pole edges of the sector collimator enables such large angle deflections to be achieved, which results in satisfactory isolation of the wafer from neutral particles, and yet allows the above-mentioned ion optical transport and focusing constraints to be realized. In this embodiment, the working gap 88 of the sector collimator magnet 80 is positioned to properly receive the scanned beam 90; working gap 88 is oriented and located such that its focal plane coincides with the scan apex 57. Also, the beam is transported from source 44 to wafer 65 entirely in a high vacuum maintained inside an envelope 74 by vacuum pumps 76.

Figure 14:
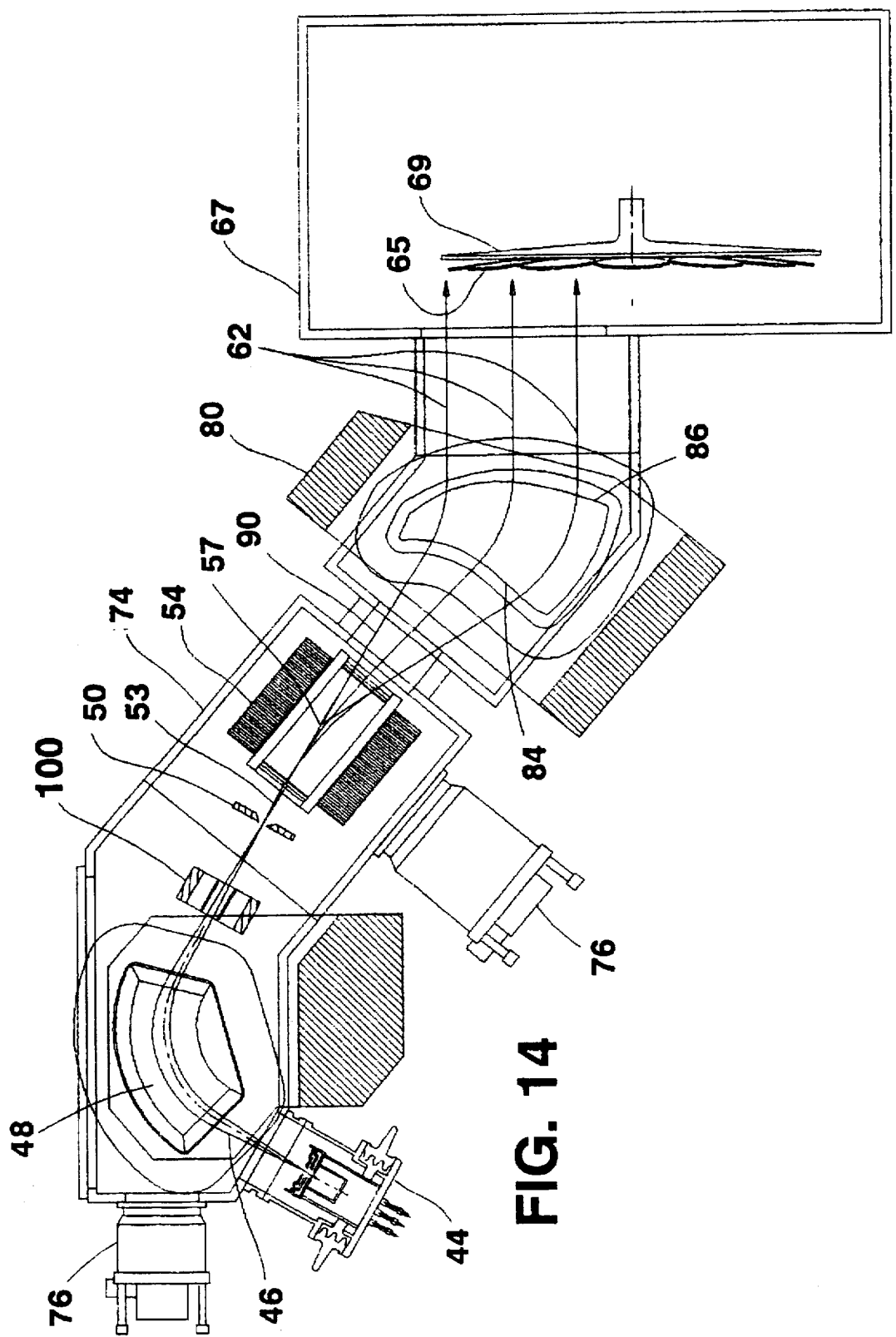
FIG. 14 is a diagrammatic cross-sectional view of an ion beam system for magnetically scanning an ion beam across the surface of a silicon wafer.

Other embodiments are within the scope of the claims. For example, in another preferred embodiment, rather than having a single wafer reciprocating through the scanning beam, as shown in FIG. 13, several wafers can be mounted on a rotating carousel 69 as shown in FIG. 14. This embodiment is preferred in the case of very high ion beam currents because then the high beam power is distributed over several wafers during implantation.

Application to Magnetic Resonant Imaging

Figure 15:
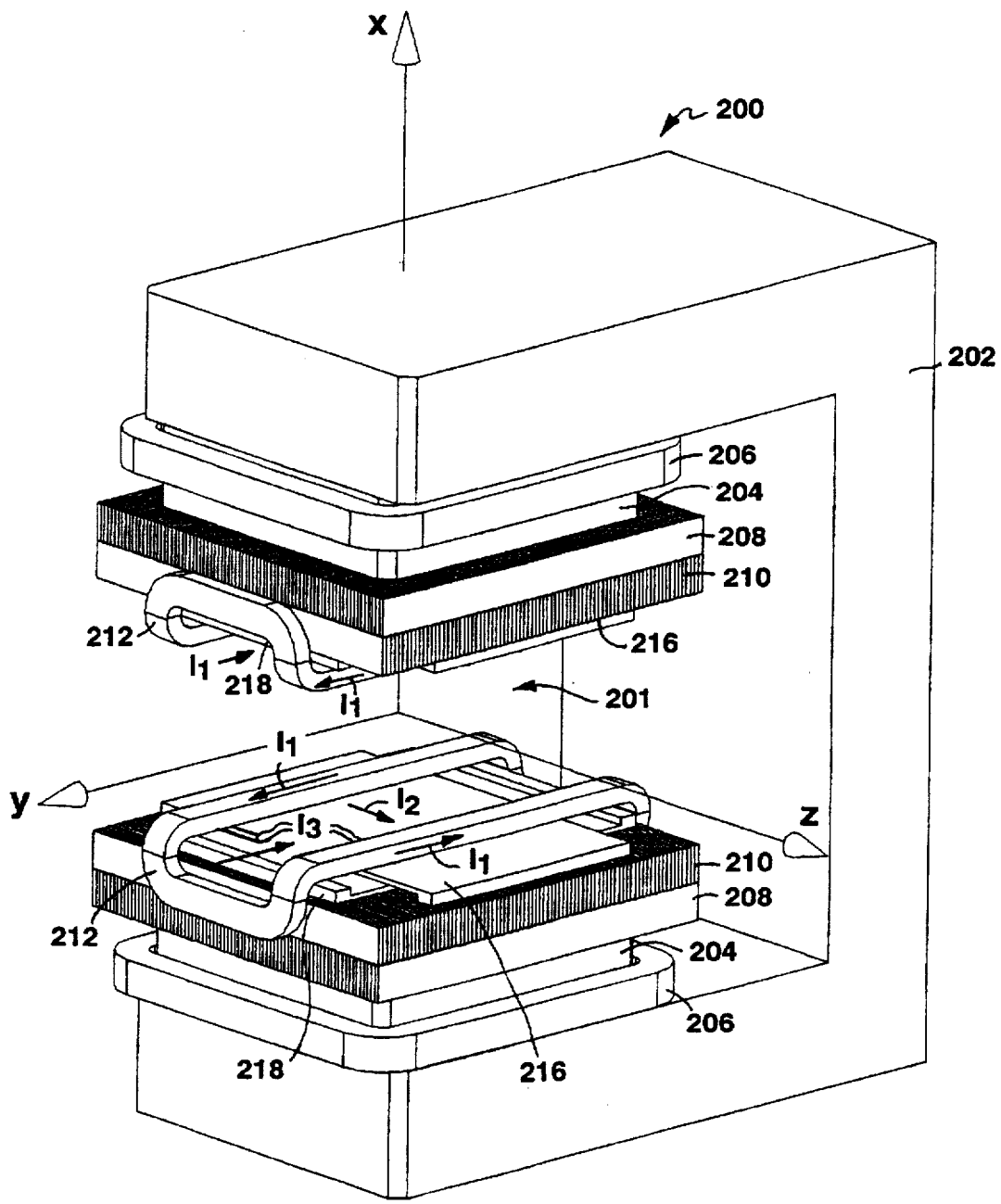
FIG. 15 is a diagrammatic perspective view of a magnetic system for use in a magnetic resonance imaging system that includes ac gradient coils.

As shown in FIG. 15, a magnetic system 200 produces time-varying magnetic field gradients $\partial B/\partial x$, $\partial B/\partial y$, $\partial B/\partial z$ in the x, y, z directions, respectively, superimposed on a static uniform field B in the z-direction in a working gap 201. The static field is generated by the dc current-carrying coils 206, and the low reluctance path of the high permeability iron cross-laminated poles 208, 210, the solid iron cores 204 and the solid yoke return 202. The time-varying field gradient $\partial B/\partial x$ is produced by oscillatory currents $I_1$ in the gradient coils 212, and the other gradient field components $\partial B/\partial y$, $\partial B/\partial z$ are produced by oscillatory current sheets $I_2$ and $I_3$, in the electrical conducting sheets 216 and 218, which are electrically isolated from one another by electrically insulating material. The time-dependent spatial variation of the resultant magnetic field $B_r(x,y,z)$, given by $$B_r(x,y,z) = B + x\frac{\partial B}{\partial x} + y\frac{\partial B}{\partial y} + z\frac{\partial B}{\partial z}, \tag{14}$$

which results in spin resonance of a given frequency at spatial positions which vary with time, which in turn allows image information to be derived. The crossed laminations in the poles provide low-reluctance return paths for the time-varying components of the field, and the solid cores and yokes provide a return path for the static field. This structure enables the power sources for the gradient coils to be operated independently of the main dc power supply which produces the primary static field. The crossed lamination poles are efficient structures for concentrating the time-varying field components in the working gap 201 between the opposite pole faces and reduce errors and difficulties associated with eddy currents and power losses that would otherwise occur if the poles were formed of solid iron rather than laminations.

In another embodiment, the pole pieces are constructed from high permeability ferrite material.

Still other embodiments are within the scope of the claims.

What is claimed is:

1. An apparatus for producing a magnetic field having static and high frequency time-varying components comprising:

two magnetic poles defining a gap therebetween, the poles being formed with electrically insulating material for confining any high frequency induced eddy currents to limited values in local paths in the poles;

an ac coil associated with the magnetic poles for producing a time-varying magnetic field in the gap;

a magnetic structure including a yoke and two cores which are respectively coupled to the two poles, the magnetic structure being formed of solid material, with a high magnetic saturation level; and dc coils associated with the cores of the magnetic structure for producing a static magnetic field in the gap.

2. An apparatus for producing a magnetic field modulated at a fundamental frequency of at least 20 Hz for scanning an ion beam over a selected surface comprising:

two magnetic poles defining a gap therebetween, the poles being formed with electrically insulating material for confining any high frequency induced eddy currents to limited values in local paths in the poles;

an ac coil associated with the magnetic poles for producing a time-varying magnetic field in the gap;

a magnetic structure including a yoke and two cores which are respectively coupled to the two poles, the magnetic structure being formed of solid material, with a high magnetic saturation level; and dc coils associated with the cores of the magnetic structure for producing a static magnetic field in the gap;

an ac current source for energizing the ac coil with a time-varying oscillatory electric current to produce a magnetic field in the gap that alternates in direction with time at a fundamental frequency of the order of 20 Hz or greater together with substantially higher order harmonics; and a dc current source for energizing the dc coil 5 with a static electric current to produce the static magnetic field in the gap.

3. The apparatus of claim 1 or 2 wherein the poles are formed from a plurality of laminations of high magnetic permeability material separated by electrically insulating layers, the laminations providing a low reluctance magnetically permeable path for the high frequency time-varying component of the produced magnetic field.

4. The apparatus of claim 3 wherein each of the laminations has a thickness in the range between about 0.2 and 1 millimeter.

5. The apparatus of claim 3 wherein the insulating layers are substantially thinner than the laminations.

6. The apparatus of claim 3 wherein the laminations are iron alloy laminations.

7. The apparatus of claim 3 further comprising a liner for shielding the laminated poles from an ion beam.

8. The apparatus of claim 7 wherein the liner consists of silicon.

9. The apparatus of claim 1 or 2 wherein the poles comprise different sets of laminations of high magnetic permeability material separated by electrically insulating material, the sets being disposed cross-wise to each other so that magnetic flux passing through any given lamination in one of the sets is distributed into a multiplicity of laminations in another of the sets.

10. The apparatus of claim 1 or 2 wherein the yoke and cores are formed of solid iron.

11. The apparatus of claim 1 further comprising an ac current source for energizing the ac coil with an oscillatory electric current to generate a magnetic field alternating in direction with time at a fundamental frequency of the order of 20 Hz or greater together with substantially higher order harmonics.

12. The apparatus of claim 1 or 2 wherein the poles are formed from ferrite material.

13. The apparatus of claim 12 further comprising a liner for shielding the ferrite material from an ion beam.

14. The apparatus of claim 2 further comprising a source of an ion beam to introduce the ion beam into the gap.

15. The apparatus of claim 14 further comprising an end station arranged to position in the path of the scanned ion beam a semiconductor substrate having a selected surface for receiving the scanned ion beam.

16. The apparatus of claim 15 further comprising a vacuum housing extending from the ion source, about the magnetic structure to the end station whereby the beam is exposed directly to the poles as the beam travels under vacuum from the ion source to the end station.

17. The apparatus of claim 15 further comprising a velocity separator disposed in the path of the ion beam for removing singly-charged ions from the ion beam before the ion beam irradiates the selected surface so that higher final ion energies can be obtained from the multiply-charged ions remaining in the beam.

18. The apparatus of claim 14 wherein the ion beam passes into the gap along a first beam path, the apparatus further comprising a dc sector magnet positioned to receive the ion beam after the beam has passed through the gap and has been deflected to one side of the first beam path as a result of the influence of the scanning magnetic field.

19. An apparatus for producing a magnetic field having static and high frequency time-varying components comprising:

two magnetic poles defining a gap therebetween, the poles being formed from a plurality of laminations of high magnetic permeability material separated by electrically insulating layers, the laminations providing a low reluctance magnetically permeable path for the high frequency time-varying component of the produced magnetic field;

an ac coil associated with the magnetic poles for producing a time-varying magnetic field in the gap;

a magnetic structure including a yoke and two cores which are respectively coupled to the two poles, the magnetic structure being formed of solid material, with a high magnetic saturation level; and dc coils associated with the cores of the magnetic structure for producing a static magnetic field in the gap.

20. An apparatus for producing a magnetic field having static and high frequency time-varying components comprising:

two magnetic poles defining a gap therebetween, the poles comprise different sets of laminations of high magnetic permeability material separated by electrically insulating material, the sets being disposed cross-wise to each other so that magnetic flux passing through any given lamination in one of the sets is distributed into a multiplicity of laminations in another of the sets;

an ac coil associated with the magnetic poles for producing a time-varying magnetic field in the gap;

a magnetic structure including a yoke and two cores which are respectively coupled to the two poles, the magnetic structure being formed of solid material, with a high magnetic saturation level; and dc coils associated with the cores of the magnetic structure for producing a static magnetic field in the gap.

21. The apparatus of claim 20 further comprising a first pair of electrical conductors, each of the first pair of conductors being positioned at opposite sides of the gap, the first conductors being constructed and arranged to produce a first magnetic gradient field over a substantial portion of the region of the gap.

22. The apparatus of claim 21 further comprising a second pair of electrical conductors, each of the second pair of conductors being positioned at opposite sides of the gap, the conductors of the second pair being constructed and arranged to produce a second magnetic gradient field over a substantial portion of the region of the gap, the first magnetic gradient field intersecting the second magnetic gradient field.

23. The apparatus of claim 22 wherein the first pair of conductors extend in a first direction in a plane parallel to the pole faces and the second pair of conductors extend in a plane parallel to the first pair of conductors in a direction orthogonal to the first direction.

24. An apparatus for producing a magnetic field having static and high frequency time-varying components comprising:

two magnetic poles defining a gap therebetween, the poles being formed from high magnetic permeability ferrite material;

a first pair of electrical conductors, each of the first pair of conductors being positioned at opposite sides of the gap, the first conductors being constructed and arranged to produce a first magnetic gradient field over a substantial portion of the region of the gap;

an ac coil associated with the magnetic poles for producing a time-varying magnetic field in the gap;

a magnetic structure including a yoke and two cores which are respectively coupled to the two poles, the magnetic structure being formed of solid material, with a high magnetic saturation level; and dc coils associated with the cores of the magnetic structure for producing a static magnetic field in the gap.

25. The apparatus of claim 24 further comprising a second pair of electrical conductors, each of the second pair of conductors being positioned at opposite sides of the gap, the conductors of the second pair being constructed and arranged to produce a second magnetic gradient field over a substantial portion of the region of the gap, the first magnetic gradient field intersecting the second magnetic gradient field.

26. The apparatus of claim 25 wherein the first pair of conductors extend in a first direction in a plane parallel to the pole faces and the second pair of conductors extend in a plane parallel to the first pair of conductors in a direction orthogonal to the first direction.

27. A method for scanning an ion beam over a selected surface comprising the steps of:

providing a scanning magnet comprising
two magnetic poles defining a gap therebetween, the poles being formed with electrically insulating material for confining any high frequency induced eddy currents to limited values in local paths in the poles, an ac coil associated with the magnetic poles for producing a time-varying magnetic field in the gap, a magnetic structure including a yoke and two cores which are respectively coupled to the two poles, the magnetic structure being formed of solid material, with a high magnetic saturation level, and dc coils associated with the cores of the magnetic structure for producing a static magnetic field in the gap;

passing an ion beam into the gap along a first beam path; and generating in the ac and dc coils energizing waveforms to produce in the gap a substantially unipolar scanning magnetic field that varies in magnitude as a function of time to cause scanning of the ion beam over the selected surface.

28. The method of claim 27 comprising the step of further deflecting the ion beam away from the first beam path after the beam has passed through the gap and has been deflected to one side of the first beam path so that the beam travels at a substantial angle relative to the direction of the first beam path to cause a substantial proportion of neutral particles that may exist in the beam to be removed from the beam before the beam irradiates the selected surface.

* * * * *